(12) United States Patent
Dan (10) Patent No.: US 11,096,273 B2
(45) Date of Patent: Aug. 17, 2021

(54) PRINTED CIRCUIT BOARDS INCLUDING A RIGID REGION ON WHICH DEVICES OR CONNECTORS ARE TO BE MOUNTED AND A FLEXIBLE REGION THAT IS BENDABLE, AND METHODS OF MANUFACTURING SAME

(71) Applicant: AMOSENSE CO., LTD., Cheonan-si (KR)

(72) Inventor: Sung-Baek Dan, Gyeonggi-do (KR)

(73) Assignee: AMOSENSE CO., LTD., Cheonan-si (KR)

(*) Notice: Subject to any disclaimer, the term of this patent is extended or adjusted under 35 U.S.C. 154(b) by 0 days.

(21) Appl. No.: 16/500,389

(22) PCT Filed: Apr. 3, 2018

(86) PCT No.: PCT/KR2018/003914
§ 371 (c)(1),
(2) Date: Oct. 2, 2019

(87) PCT Pub. No.: WO2018/186654
PCT Pub. Date: Oct. 11, 2018

(65) Prior Publication Data
US 2020/0092981 A1    Mar. 19, 2020

(30) Foreign Application Priority Data

Apr. 5, 2017 (KR) .................. 10-2017-0044063
Apr. 5, 2017 (KR) .................. 10-2017-0044064

(51) Int. Cl.
*H05K 1/02* (2006.01)
*H05K 1/03* (2006.01)
(Continued)

(52) U.S. Cl.
CPC .......... *H05K 1/028* (2013.01); *H05K 1/0366* (2013.01); *H05K 1/09* (2013.01); *H05K 1/115* (2013.01);
(Continued)

(58) Field of Classification Search
CPC   H05K 1/02; H05K 1/028; H05K 1/09; H05K 1/115; H05K 1/0366
(Continued)

(56) References Cited

U.S. PATENT DOCUMENTS 7,815,441 B2   10/2010   Kobayashi
8,631,567 B2   1/2014    Lee
(Continued)

FOREIGN PATENT DOCUMENTS

JP   2010-123629   6/2010
JP   2012-234937   11/2012
(Continued)

*Primary Examiner* — Tremesha S Willis
(74) *Attorney, Agent, or Firm* — Wells St. John P.S.

(57) ABSTRACT

Disclosed are a printed circuit board manufactured by filling a via hole formed in a flexible board and a via hole formed in a cured base substrate and then laminating the flexible board and the cured base substrate and a method of manufacturing same. The method includes preparing a flexible board including a flexible region and a rigid region, preparing a cured base substrate, and laminating the cured base substrate on the rigid region of the flexible board, in which during the laminating, via holes respectively formed in the flexible board and the cured base substrate are first filled with a conductive material and then the flexible board and the cured base substrate are laminated.

3 Claims, 4 Drawing Sheets

(51) Int. Cl.
 *H05K 1/09* (2006.01)
 *H05K 1/11* (2006.01)
 *H05K 3/06* (2006.01)
 *H05K 3/28* (2006.01)
 *H05K 3/42* (2006.01)
 *H05K 3/46* (2006.01)

(52) U.S. Cl.
 CPC .......... *H05K 3/06* (2013.01); *H05K 3/28* (2013.01); *H05K 3/429* (2013.01); *H05K 3/4644* (2013.01); *H05K 2201/0145* (2013.01); *H05K 2201/0154* (2013.01)

(58) Field of Classification Search
 USPC ........................................................ 174/254
 See application file for complete search history.

(56) References Cited

U.S. PATENT DOCUMENTS

| | | |
|---|---|---|
| 8,658,904 B2 | 2/2014 | Naganuma |
| 2014/0034367 A1 | 2/2014 | Lee |

FOREIGN PATENT DOCUMENTS

| | | |
|---|---|---|
| KR | 10-2008-0033172 | 4/2008 |
| KR | 10-2009-0010105 | 1/2009 |
| KR | 10-1168514 | 7/2012 |
| KR | 10-1196529 | 11/2012 |
| KR | 10-1388750 | 4/2014 |
| KR | 10-2015-0075841 | 7/2015 |
| KR | 10-2015-0134777 | 12/2015 |
| KR | 10-2016-0080855 | 7/2016 |
| KR | 10-2016-0099934 | 8/2016 |
| WO | WO2007-013595 | 2/2007 |

PRINTED CIRCUIT BOARDS INCLUDING A RIGID REGION ON WHICH DEVICES OR CONNECTORS ARE TO BE MOUNTED AND A FLEXIBLE REGION THAT IS BENDABLE, AND METHODS OF MANUFACTURING SAME

CROSS REFERENCE TO RELATED APPLICATION

This is a 35 U.S.C. §371 application of, and claims priority to, International Application No. PCT/KR2018/003914, which was filed on Apr. 3, 2018, and claims priority to Korean Patent Application No. 10-2017-0044063, filed on Apr. 5, 2017, and to Korean Patent Application No. 10-2017-0044064, filed on Apr. 5, 2017, the teachings of which are incorporated herein by reference.

TECHNICAL FIELD

The present disclosure relates to a printed circuit board and a method of manufacturing same. More particularly, the present disclosure relates to a rigid flexible printed circuit board including a rigid region on which devices or connectors are to be mounted and a flexible region that is bendable.

BACKGROUND ART

As miniaturization and thinning of electronic devices progress, miniaturization and thinning of printed circuit boards used to mount electronic devices thereon are required. For this reason, multilayer flexible printed circuit boards are becoming rapidly widespread. However, multilayer flexible printed circuit boards are more expensive and exhibit a higher defect ratio than rigid printed circuit boards because the manufacturing method is more complicated and consists of more process steps.

Accordingly, recently rigid and flexible printed circuit boards (hereinafter, referred to as rigid flexible printed circuit boards) that can be manufactured through a relatively simple manufacturing method and exhibit a low defect ratio have been more actively adopted in comparison with multilayer flexible printed circuit boards. Thus, rigid flexible printed circuit boards are expected to exhibit a rapid growth in market share.

A rigid flexible printed circuit board aggregates multiple boards into one printed circuit board without using connectors or cables that connect the boards mounted in an electronic component. Therefore, the rigid flexible printed circuit board has advantages of reducing the delay and distortion of an electrical signal and reducing the volume of an electronic component.

However, a conventional rigid flexible printed circuit board is manufactured by bonding prepreg and metal such as copper to a flexible printed circuit board (FPCB), forming via holes, and forming a copper layer in each of the via holes through plating. In this case, that is, in the case where the copper layer is formed on the inside wall surface of each of the via holes through plating and etching after the via holes are formed, the manufacturing process of the conventional rigid flexible printed circuit board is complicated.

On the other hand, a printed circuit board is a laminate of multi-layered base substrates at least one of which is provided with a circuit pattern.

In addition, an adhesive layer is provided on one or more surfaces of each of the base substrates for bonding of the base substrates when the laminate of multi-layered base substrates is prepared. That is, conventionally, a plurality of base substrates, each being composed of a base film and an adhesive layer (so-called sealant) formed on at least one surface of the base film, is laminated, and then the laminate is heated to a predetermined temperature (hereinafter referred to as adhesion temperature or first temperature) so that the base substrates are bonded to each other.

In this case, the base film may be made of polypropylene (PP) having a melting point (hereinafter, also referred to as processing temperature or second temperature) of about 160° C., and the adhesive layer may be made of polyolefin-based polymer having an adhesion temperature in a range from 140° C. to 150° C.

Thus, when base substrates that are laminated to form a multilayer printed circuit board are heated at or above 140° C., there is a problem that thermal deformation occurs in the base films of the base substrates. That is, since the difference between the processing temperature (that is, melting point) of the base film and the adhesion temperature of the adhesive layer is as small as about 20° C., even though a small force is applied, the base substrates are easily deformed because the base films of the base substrates are softened during the heating for bonding of the base substrates.

Therefore, there is also a problem in that the alignment accuracy of circuit patterns formed on the base substrates is lowered, resulting in an increase in the risk of occurrence of defects in the multilayer printed circuit board.

DISCLOSURE

Technical Problem

The present disclosure is made to address the problems occurring in the related art and an objective of the present disclosure is to provide a printed circuit board manufactured by filling via holes formed in a flexible board and via holes formed in a cured base substrate with a conductive material and then laminating the flexible board and the cured base substrate. That is, the objective of the present disclosure is to provide a printed circuit board that can be manufactured through a manufacturing method that is simple and can prevent base substrates from being deformed during the base substrates are laminated to form the printed circuit board. Another objective of the present disclosure is to provide a method of manufacturing a printed circuit board having the same advantage.

Technical Solution

In order to accomplish the objectives of the present disclosure, there is provided a method of manufacturing a printed circuit board, the method including: preparing a flexible board including a flexible region and a rigid region, preparing a cured base substrate, and laminating the cured base substrate on the rigid region of the flexible board, in which during the laminating, one or more via holes formed in the flexible board and one or more via holes formed in the cured base substrate are filled with a conductive material, and then the flexible board and the cured base substrate are laminated.

According to a preferred embodiment, the preparing of the flexible board may include: preparing a flexible base substrate; forming a first via hole in a flexible region of the flexible base substrate; plating a surface of the flexible base substrate and an inside wall surface of the first via hole to form a plating layer, selectively etching the plating layer to form an internal circuit pattern; and forming a protective layer to cover the internal circuit pattern.

The cured base substrate is a prepreg that is formed by shaping an epoxy region in which glass fiber is contained in the form of a sheet.

According to one embodiment, the laminating may include: forming a second via hole in the rigid region of the flexible board; filling the second via hole formed in the flexible board with a conductive material, forming a second via hole in the cured base substrate, filling the second via hole formed in the cured base substrate with a conductive material, laminating the cured base substrate on the rigid region of the flexible board; and forming an external circuit pattern on a surface of the cured base substrate laminated on the flexible board. During the laminating of the cured base substrate, the second via hole formed in the cured base substrate may be disposed on the second via hole formed in the flexible board.

According to another embodiment, the laminating may include: stacking the cured base substrate on the rigid region of the flexible board, forming a second via hole in the cured base substrate and the flexible board; filling the second via hole with a conductive material; and forming an external circuit pattern on one surface of the cured base substrate.

In order to accomplish the objective of the present disclosure, there is provided a printed circuit board including: a flexible board including a flexible region and a rigid region and provided with an internal circuit pattern; a cured base substrate having an external circuit pattern formed on surface thereof and being laminated on the rigid region of the flexible board; and a second via hole formed in the flexible board and the cured base substrate, filled with a conductive material, and connected to the internal circuit pattern and the external circuit pattern.

The flexible board may include: a flexible base substrate; a first via hole formed to pass through the flexible region of the flexible board in a thickness direction; the internal circuit pattern formed on a first surface and a second surface of the flexible base substrate and on an inside wall surface of the first via hole, and a protective layer formed on the internal circuit pattern. The flexible base substrate may be a flexible film made of any one material selected from the group consisting of polyimide, polyethylene terephthalate, and polyester.

The cured base substrate may be a prepreg that is formed by shaping an epoxy region in which glass fiber is contained in the form of a sheet.

The cured base substrate may have a first surface on which the external circuit pattern is formed and which is opposite to a second surface being in contact with the flexible board, and the external circuit pattern may be made of copper or silver.

The second via hole may be filled with a conductive material that is any one material selected from among Ag—Pd alloy, Ag paste, nano paste, and Sn solder paste.

Advantageous Effects

According to the present disclosure, when the printed circuit board is bent because the circuit patterns to be connected to each other are disposed at different positions, the printed circuit board and the manufacturing method therefor have an advantage that the printed circuit board is not easily fractured.

In addition, the printed circuit board and the manufacturing method therefor according to the present disclosure have an advantage of reducing the possibility of the fracture of the printed circuit board when connectors are engaged with other, in comparison with a conventional flexible printed circuit board.

In addition, the printed circuit board and the manufacturing method therefor have an advantage of preventing connection failure between the internal circuit pattern and the external circuit pattern by connecting the internal circuit pattern with the external circuit pattern using the via hole filled with a conductive material.

In addition, the printed circuit board according to the present disclosure is manufactured by forming the via holes in the flexible board and the cured base substrate, filling the via holes with a conductive material, and laminating the flexible board and the cured base substrate. Therefore, the printed circuit board and the manufacturing method therefor according to the present disclosure have an advantage of simplifying the manufacturing method in comparison with related arts.

That is, compared with a conventional printed circuit board that is manufactured by forming via holes, forming a plating layer, selectively etching the plating layer to form a plating pattern on the inside wall surface of each of the via holes, the printed circuit board and the manufacturing method therefor according to the present disclosure can simplify the manufacturing process by not requiring a plating process and an etching process.

In addition, when the present disclosure is applied to a multilayer printed circuit board, the adhesive layer is provided on one surface of the base substrate and the adhesion temperature of the adhesive layer is set to be lower than the melting point of the base film of the base substrate. Therefore, it is possible to prevent the base substrates from being deformed by heat at the time of bonding the base substrates to each other.

In addition, the present disclosure prevents thermal deformation of the base substrates, thereby preventing deterioration of alignment accuracy of circuit patterns. Therefore, it is possible to reduce a defect ratio of multiplayer printed circuit boards.

In addition, since the adhesive layer used to form a multilayer printed circuit board is made of a thermosetting resin having a composition ratio in which the proportion of polyethylene is higher than that of polypropylene, the adhesion temperature can be lowered to a temperature that is 40° C. or more lower than the melting point of the polypropylene base film.

In addition, since the adhesive layer used to bond the base substrates to each other to form a multilayer printed circuit board is formed to have a thickness larger than that of an object to which the adhesive layer is to be attached, it is possible to prevent the bonding force between the base substrates of the multilayer printed circuit board from being insufficient. Thus, it is possible to prevent the reliability of the multilayer printed circuit board from being deteriorated.

DESCRIPTION OF DRAWINGS

FIGS. 8 to 10 are views illustrating a multilayer printed circuit board according to one embodiment of the present disclosure.

BEST MODE

Hereinafter, preferred embodiments of the present disclosure will be described in detail with reference to the accompanying drawings in order to facilitate a person skilled in the art to easily carry out the technical idea of the present disclosure. First, components are denoted by reference numerals such that like components are denoted by like reference signs or numerals throughout the drawings. Further, in describing exemplary embodiments of the present disclosure, well-known functions or constructions will not be described in detail since they may unnecessarily obscure the understanding of the present disclosure.

Figure 1:
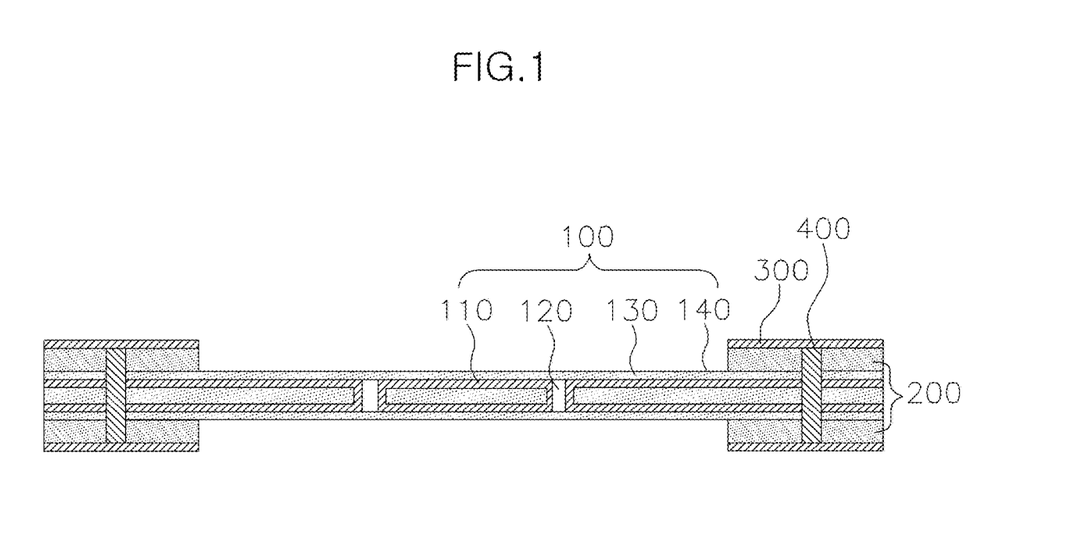
FIG. 1 is a diagram illustrating a printed circuit board according to one embodiment of the present disclosure.

Referring to FIG. 1, a printed circuit board according to an exemplary embodiment of the present disclosure includes a flexible board 100, a cured base substrate 200 stacked on a rigid region of the flexible board 100, and an external circuit pattern 300 that is formed on one surface of the cured base substrate 200 and which is connected to an internal circuit pattern 130.

The internal circuit pattern 130 is formed on a first surface and a second surface of a flexible base substrate 110 of the flexible board 100. The internal circuit pattern 130 formed on the first surface of the flexible base substrate 110 of the flexible board 100 is connected to the internal circuit pattern 130 formed on the second surface of the flexible base substrate 110 via a first via hole 120 formed in the flexible board 100. The surfaces of the flexible board 100 and the internal circuit patterns 130 are covered with a protective layer 140.

The flexible base substrate 110 is made of resin having ductility. In this case, the flexible base substrate 110 is made from a polyimide (PI) film, a polyethylene terephthalate (PET) film, a polyester film, or the like.

The first via hole 120 is formed to extend through the flexible base substrate 110, in a direction of thickness, from the upper surface to the lower surface. That is, the first via hole 120 is formed to pass through a flexible region of the flexible base substrate 110 in the direction of thickness. The inside wall surface of the first via hole 120 is coated with a plating layer 130 which electrically connects the internal circuit pattern 130 formed on the first surface of the flexible base substrate 110 with the internal circuit pattern 130 formed on the second surface of the flexible base substrate 110.

The internal circuit pattern 130 is formed on the first surface and the second surface of the flexible base substrate 110. In this case, the internal circuit pattern 130 is made from a plating layer 130 that is formed on the surfaces of the flexible base substrate 110 and on the inside wall surface of the first via hole 120. Here, the internal circuit pattern 130 (that is, the plating layer) is formed by electroplating the flexible base substrate 110 with copper (Cu), silver (Ag), or the like.

The protective layer 140 is a synthetic resin coating layer made from a coating solution based on the same material as the flexible base substrate 110, thereby having good adhesion to the flexible base substrate 110. Therefore, the protective layer 140 firmly adheres to the flexible base substrate 110. That is, when the flexible base substrate 110 is made of a polyimide film, the protective layer 140 is, for example, a polyimide coating layer or a polyamide-imide (PAI) coating layer.

The cured base substrate 200 is formed by impregnating glass fiber with a thermosetting resin and semi-curing the thermosetting resin. Here, the cued base substrate 200 is a prepreg sheet that is prepared by shaping an epoxy resin in which soft glass fiber is contained in the form of a sheet.

The cured base substrate 200 is disposed on the rigid region of the flexible board 100. The cured base substrate 200 disposed on the rigid region of the flexible board 100 undergoes a hot press process to be cured and bonded to the flexible board 100.

The external circuit pattern 300 is formed on a first surface of the cured base substrate 200. That is, the external circuit pattern 300 is formed on the first surface of the cured base substrate 200, the first surface being opposite to a second surface that is in contact with the flexible board 100. In this case, the to external circuit pattern 300 is made from a conductive film. The conductive film is, for example, a copper (Cu) film, a silver (Ag) film, or the like.

The external circuit pattern 300 is formed by laminating a conductive film (for example, metal layer) on the cured base substrate 200 and then removing a portion of the conductive film through a masking process and an etching process.

A second via hole 400 filled with a conductive material is formed to pass through the flexible board 100 and the cured base substrate 200 in a direction of thickness of the flexible board 100 and the cured base substrate 200. Here, the conductive material is, for example, Ag—Pd alloy, Ag paste, nano paste, Sn solder paste, or the like.

The second via hole 400 connects the internal circuit pattern 130 formed on the flexible board 100 with the external circuit pattern 300 formed on the first surface of the cued base substrate 200. That is, the conductive material formed in the second via hole 400 electrically connects the internal circuit pattern 130 formed on the first and second surfaces of the flexible base substrate 110, the external circuit pattern 300 formed on the cured base substrate 200 laminated on the first surface of the flexible board 100, and the external circuit pattern 300 formed on the cured base substrate 200 laminated on the second surface of the flexible board 100.

In this case, the printed circuit board is a rigid flexible printed circuit board composed of rigid regions (both end portions of the flexible board 100) that are formed by laminating the cured base substrates 200 on the respective end portions of the flexible board 100 and of a flexible region (that is, the remaining portion of the flexible board 100) that is in a flexible state.

Figure 2:
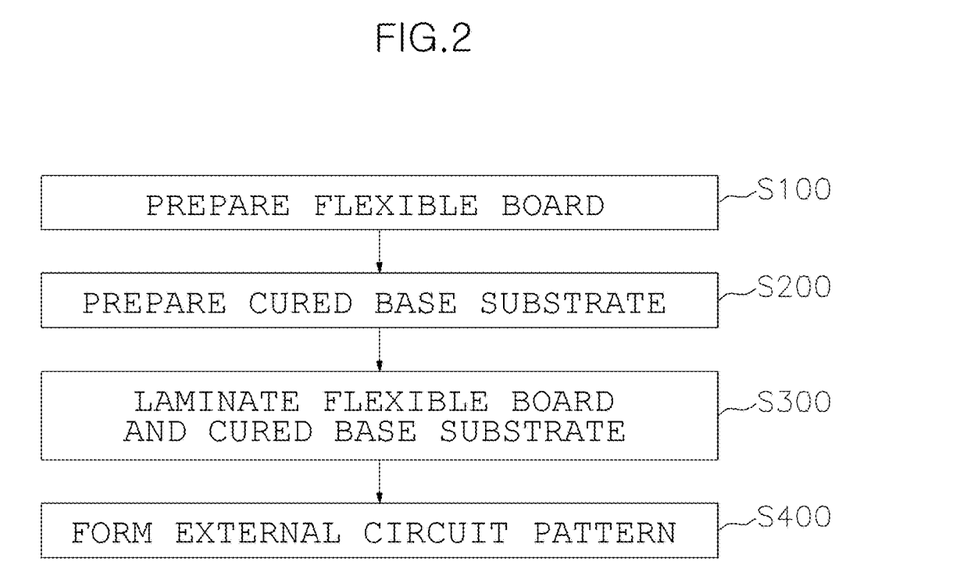
FIGS. 2 and 3 are diagrams illustrating a method of manufacturing a printed circuit board according to one embodiment of the present disclosure.
Figure 3:
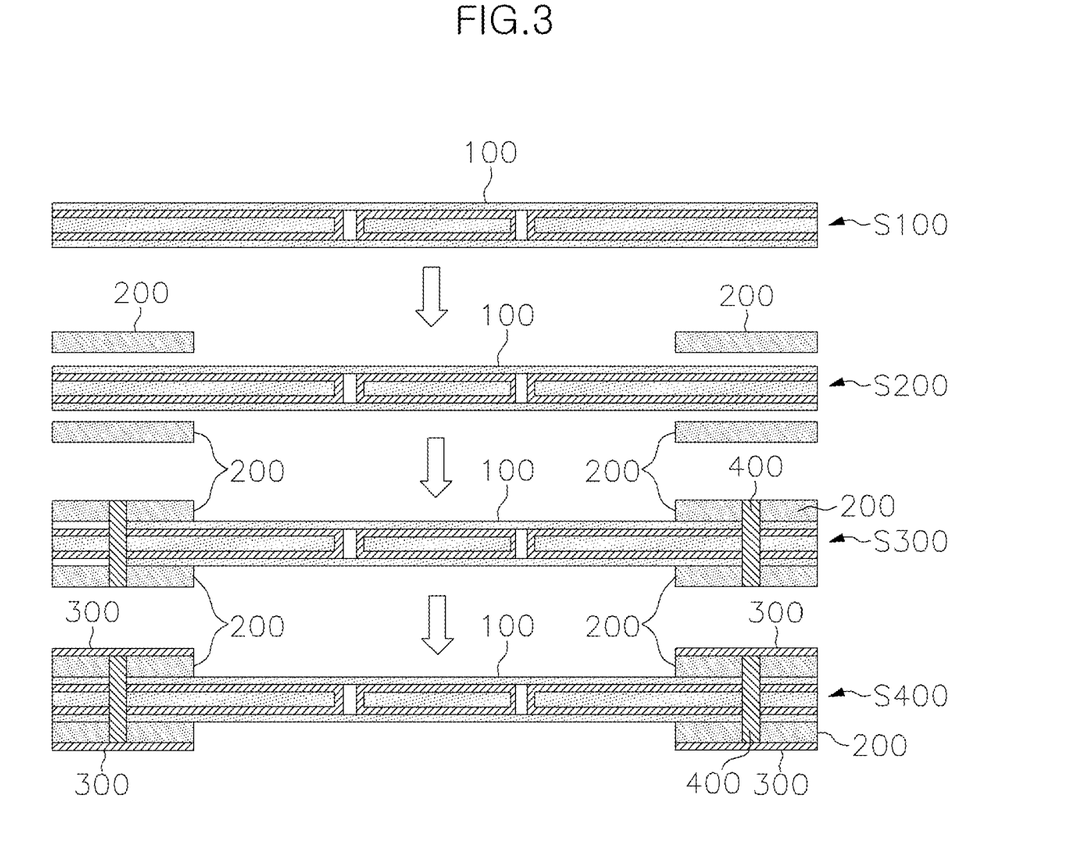

Referring to FIGS. 2 and 3, a method of manufacturing a printed circuit board according to an exemplary embodiment of the present disclosure includes step S100 of preparing a flexible board 100, step S200 of preparing a cured base substrate 200, step S300 of laminating the cured base substrate 200 on the flexible board 100, and step S400 of forming an external circuit pattern 300.

In step S100 in which the flexible board 100 is prepared, a protective layer 140 is formed on the flexible board 100 in which one or more via holes and one or more internal circuit patterns 130 are formed.

Figure 4:
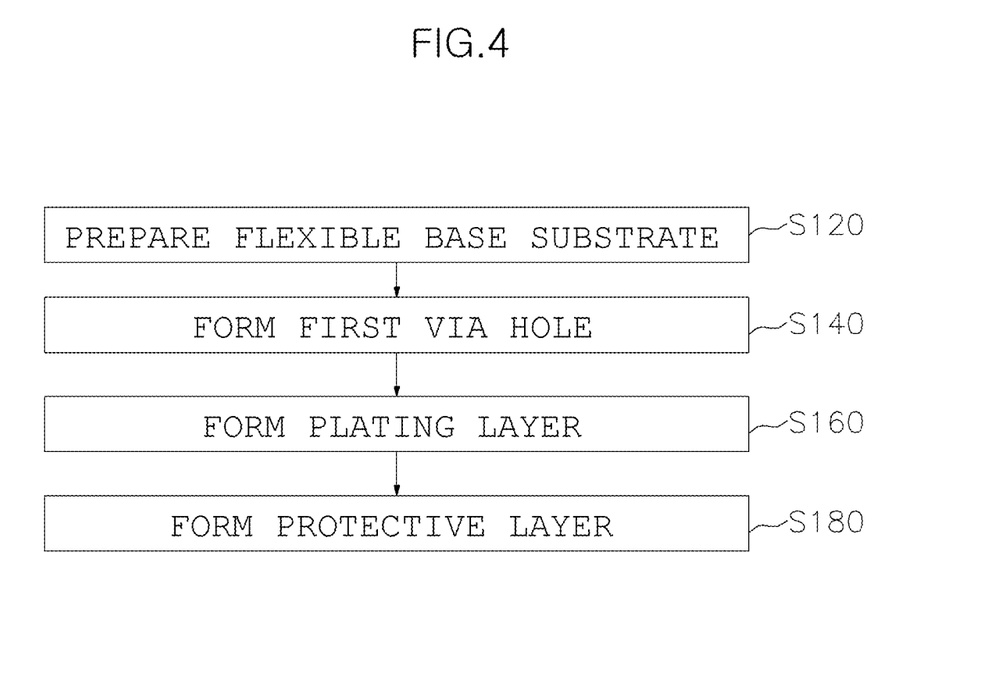
FIGS. 4 and 5 are diagrams illustrating a step of preparing a flexible board of FIGS. 2 and 3.
Figure 5:
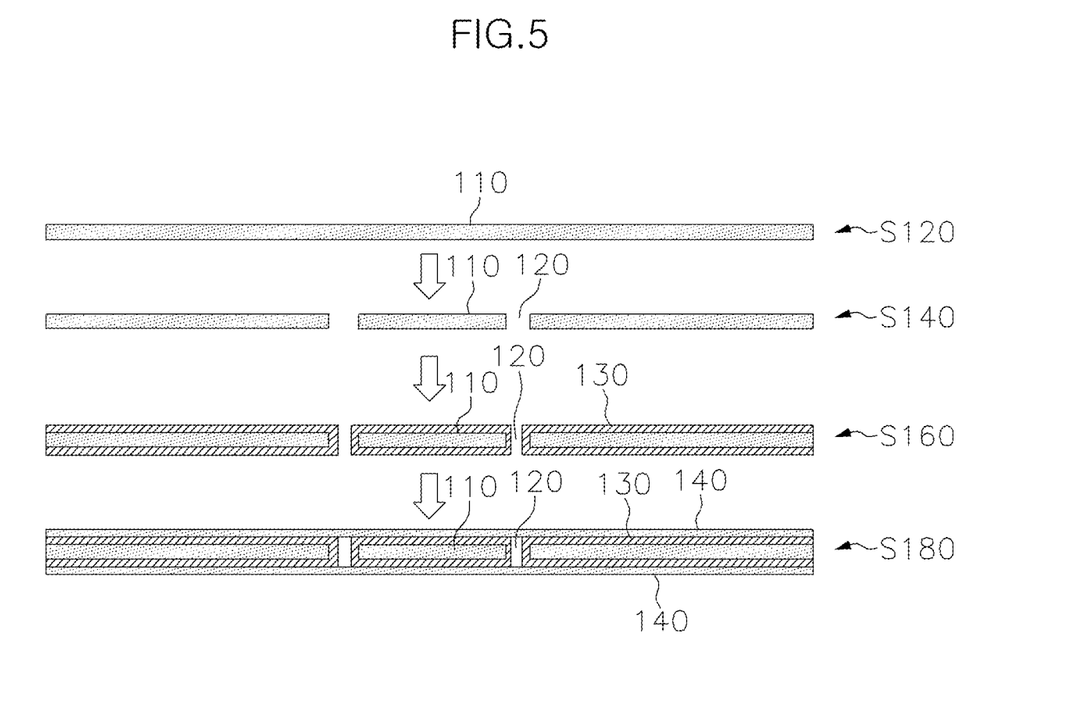

Referring to FIGS. 4 and 5, step S100 in which the flexible board 100 is prepared includes: step S120 of preparing a flexible base substrate 110; step S140 of forming one or more first via holes 120 in the flexible base substrate 110; step S160 of forming a plating layer 130 on the flexible base substrate 110; and step S180 of forming a protective layer 140 on the flexible base substrate 110.

In step S120, the flexible base substrate 110 that is made of a flexible material such as a polyimide (PI) film, a polyethylene terephthalate (PET) film, a polyester film, or the like is prepared.

In step S140, one or more first via holes 120 are formed in the flexible base substrate 110. In step S140, the one or more first via holes 120 are formed only within a flexible region of the flexible base substrate 100 but not formed within a rigid region of the flexible base substrate 110. Alternatively, in step S140, the one or more first via holes 120 may be formed in each of the flexible region and the rigid region of the flexible base substrate 110 as necessary. Here, in step S140, the one or more first via holes 120 may be formed by punching or drilling the flexible base substrate 110 to connect the internal circuit pattern 130 formed on a first surface of the flexible base substrate 110 and the internal circuit pattern 130 formed on a second surface of the flexible base substrate 110. That is, electrical conduction occurs between the internal circuit pattern 130 formed on the first surface of the flexible base substrate 100 and the internal circuit pattern 130 formed on the second surface of the flexible base substrate 110 via the one or more first via holes 120.

The flexible region of the flexible base substrate 110 is not provided with the cured base substrate 200. In this case, the flexible region is a predetermined region that occupies almost the entire area including the central region and excluding the respective end portions of the flexible base substrate 110. The rigid region is a region within which the cured base substrate 200 is laminated, of the entire area of the flexible base substrate 110. The rigid regions are provided at the respective end portions of the flexible base substrate 110.

In step S160 in which the plating layer 130 is formed, the plating layer 130 is formed on the first and second surfaces of the flexible base substrate 110 and the inside wall surface of each of the first via holes 120. In step S160 in which the plating layer 130 is formed, the plating layer 130 on the first and second surfaces of the flexible base substrate 110 is formed by electro-plating the first and second surfaces with copper (Cu) silver (Ag), or the like.

In step S160 in which the plating layer 130 is formed, the plating layer 130 on the first and second surfaces of the flexible base substrate 110 is selectively etched to form the internal circuit patterns 130. That is, in step S160 in which the plating layer 130 is formed, a masking process and an etching process are performed to remove a portion of the plating layer 130, thereby forming the internal circuit pattern 130 having a predetermined shape.

In step S180 in which the protective layer 140 is formed on the flexible base substrate 110, the protective layer 140 is formed to cover the surfaces of the internal circuit patterns 130 and the surfaces of the flexible base substrate 110. In step S180 in which the protective layer 140 is formed on the flexible base substrate 110, a liquid coating solution is applied on the surfaces of the internal circuit patterns 130, and the surfaces of the flexible base substrate 110 are cured to form the protective layer 140.

In this case, the protective layer 140 is a synthetic resin coating layer that is made from a coating solution that is of the same series as the material of the flexible base substrate 110. Thus, the protective layer 140 has good adhesion to the flexible base substrate 110, thereby being firmly bonded to the flexible base substrate 110 to form an integrated body. For example, when the flexible base substrate 110 is made of a polyimide film, the protective layer 140 is made of for example, a polyimide coating layer or a polyamide-imide (PAI) coating layer.

In step S200 in which the cured base substrate 200 is prepared, glass fiber is impregnated with a thermosetting resin which is subsequently cured to form the cured base substrate 200 that is maintained in a semi-cured state. Here, the cured base substrate 200 is a prepreg sheet that is prepared by shaping an epoxy resin in which soft glass fiber is contained in the form of a sheet.

In step S300 in which the flexible board 100 and the cured base substrate 200 are laminated, the cured base substrate 200 is laminated on the flexible board 100. In step S300 in which the flexible board 100 and the cured base substrate 200 are laminated, the cured base substrate 200 is laminated on the rigid region of the flexible board 100.

The step S300 in which the flexible board 100 and the cured base substrate 200 are laminated, one or more second via hole 400 filled with a conductive material are formed in the flexible base substrate 110 and the cured base substrate 200. The one or more second via holes 400 are connected to the internal circuit patterns 130 formed on the surfaces of the flexible board 100.

Figure 6:
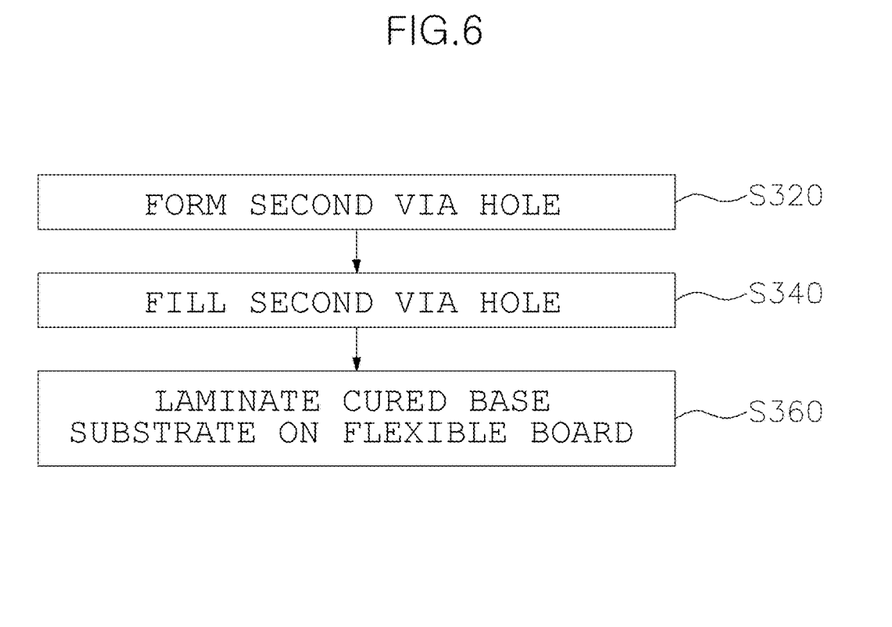
FIGS. 6 and 7 are diagrams illustrating a step of laminating the flexible board of FIGS. 2 and 3 and a cured base substrate.
Figure 7:
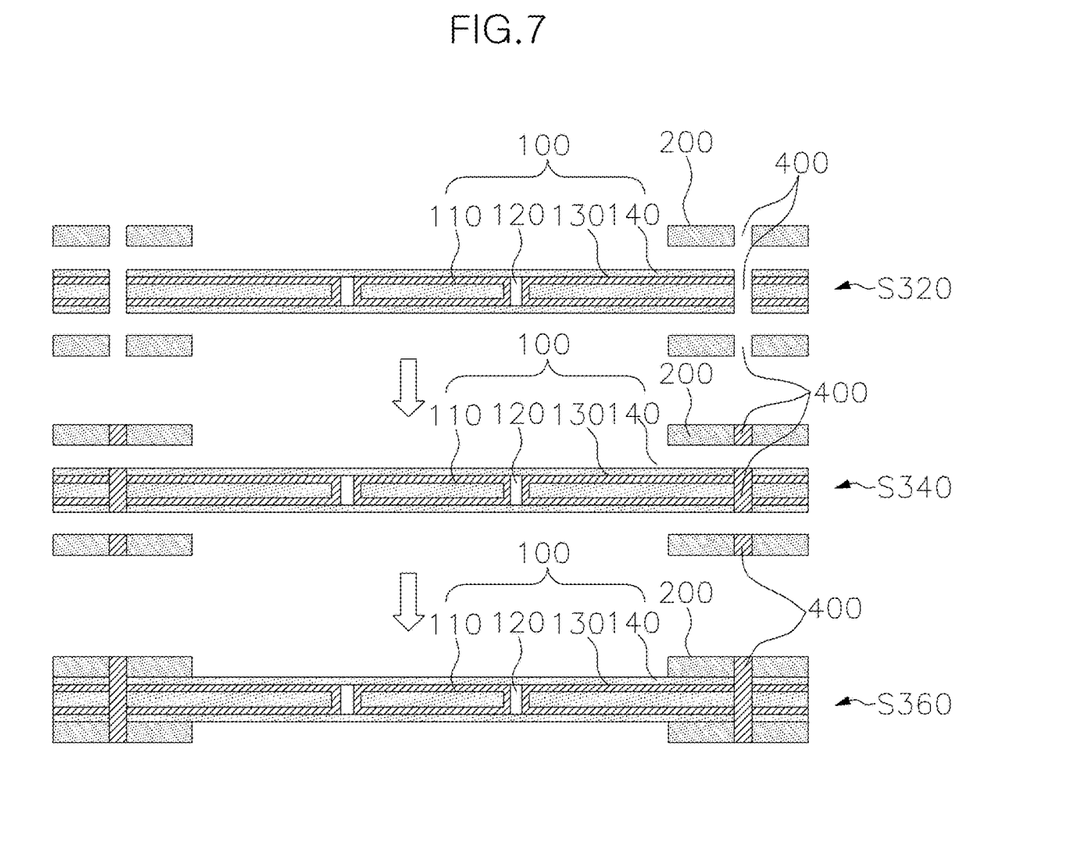

To this end, referring to FIGS. 6 and 7, step S300 in which the flexible board 100 and the cured base substrate 200 are laminated includes step S320 of forming the one or more second via holes 400, step S340 of filling the one or more second via holes 400, and step S360 of laminating the cured base substrate 200 on the flexible board 100.

In step S320 in which the second via hole 400 is formed, one or more second via holes 400 are formed in the flexible board 100. In step S320 in which the second via hole 400 is formed, the one or more second via holes 400 are formed in each of the end portions of the flexible board 100.

In step S320, the one or more second via holes 400 are formed in the cured base substrate 200. In this case, in step S320, at the time of laminating the cured base substrate 200 on the flexible board 100, the one or more second via holes 400 are formed in the cured base substrate 200 at positions corresponding to the one or more second via holes 400 formed in the flexible board 100.

Here, in step S320 in which the one or more second via holes 400 are formed, the one or more second via holes 400 are formed by punching or drilling the flexible board 100 and the cured base substrate 200 to connect the internal circuit pattern 130 formed on the flexible board 100 to the external circuit patter 300 formed on the cured base substrate 200. That is, the one or more second via holes 400 are formed to enable electrical conduction (electrical connection) between the internal circuit pattern 130 and the external circuit pattern 300.

In step S340, the one or more second via holes 400 formed in the flexible board 100 are filled with a conductive material. Here, the conductive material to fill the one or more second via holes 400 is, for example, Ag—Pd alloy, Ag paste, nano paste, Sn solder paste, or the like.

In step S360 in which the flexible board 100 and the cured base substrate 200 are laminated, the cured base substrate 200 is laminated on the rigid region of the flexible board 100. According to one embodiment, in step S360 in which the flexible board 100 and the cured base substrate 200 are laminated, the cured base substrates 200 are laminated respectively on first, second, third, and fourth rigid regions of the flexible board 100 in which the first and send rigid regions are positioned at the respective end portions of the first surface of the the flexible board 100 and the third and fourth rigid regions are positioned at the respective end portions of the second substrate of the flexible board 100. In step S360 in which the flexible board 100 and the cured base substrate 200 are laminated, a base substrate is stacked on the flexible board 100 and then heat and pressure are applied to the base substrate so that the base substrate can be cured to become the cured base substrate 200 and can be firmly bonded to the flexible board 100.

The description referring to FIGS. 6 and 7, which has been stated hereinabove, discloses an example in which the second via holes in the flexible board 100 and the second via holes in the cured base substrate 200 are separately formed and filled and then the flexible board 100 and the cured base substrate 200 are laminated after the formation of the second via holes. However, the present disclosure is not limited to that example. That is, alternatively, the lamination of the flexible board 100 and the cured base substrate 200 may be performed first, and the formation the second via holes in the cured base substrate 200 and the flexible board 100 may then be performed.

In the circuit pattern forming step S400, the external circuit pattern 300 is formed on the cured base substrate 200. In the circuit pattern forming step S400, a conductive film is laminated on one surface of the cured base substrate 200. The conductive film is, for example, a copper (Cu) film, a silver (Ag) film, or the like. In the circuit pattern forming step S400, copper (Cu), silver (Ag), or the like is to formed on one surface of the cured base substrate 200 through electro-plating.

In the circuit pattern forming step S400, a metal layer is etched to form the external circuit pattern 300 on the cured base substrate 200. That is, in the circuit pattern forming step S400, a portion of the metal layer is removed through a masking process and an etching process to form the external circuit pattern 300 having a predetermined shape.

The printed circuit board manufacturing method according to the present disclosure can provide a rigid flexible printed circuit board having rigid regions at both ends thereof and a flexible region provided between the rigid regions.

FIGS. 8 and 9 are views illustrating another embodiment of the present disclosure. When the rigid flexible printed circuit board described above constitutes one layer of a multilayer printed circuit board, the flexible base substrate 110 may be a polypropylene film. In this case, the base substrate 100 which is a polypropylene film has a processing temperature (that is, melting point) of about 160° C.

The flexible base substrate 110 has a thickness that varies according to the use of the multilayer printed circuit board that contains the flexible base substrate 110, in which the thickness of the flexible base substrate 110 may vary in a range from 20 μm to 60 μm.

In addition, the flexible base substrate may have a flexible region and rigid regions as in the previous embodiment and via holes that are filled with a conductive material.

Furthermore, the protective layer of the printed circuit board regarding the previous embodiment may be made of an adhesive layer so that two or more printed circuit boards according to the present disclosure can be bonded to each other by the protective layer, in this case, the adhesive layer may be made of a thermosetting resin that can adhere to the internal circuit pattern and the flexible base substrate 110. In this case, the adhesive layer is made of a thermoplastic resin that can bond the metal (for example, copper, silver, etc.) used as the material of the circuit pattern and the polypropylene used as the material of the flexible base substrate 110.

The adhesive layer is first formed in a liquid state on one surface of the flexible base substrate 110. That is, the adhesive layer is formed by applying a liquid mixture of liquid polypropylene and liquid polyethylene that are mixed in a predetermined ratio on one surface of the flexible base substrate 110 and curing the liquid mixture.

Alternatively, the adhesive layer may be formed in a film state on one surface of the flexible base substrate 110. That is, the adhesive layer may be formed by attaching an adhesive film made from a mixture of polypropylene and polyethylene to one surface of the flexible base substrate 110. In this case, the adhesive layer is formed by attaching an adhesive film to one surface of the flexible base substrate 110 and heating the adhesive film to a predetermined temperature (for example, adhesion temperature).

The adhesive layer has an adhesion temperature in a range from 90° C. to 120° C.

That is, when the adhesive layer has an adhesion temperature that is below 90° C., the adhesive force for bonding the internal circuit pattern and the flexible base substrate 110 is insufficient, thereby resulting in deterioration of the reliability of the multilayer printed circuit board.

In addition, when the adhesive layer has an adhesion temperature that is above 120° C., the flexible base substrate 110 experiences thermal deformation during the heating of multiple base substrates, which results in an increase in the defect ratio of the multilayer printed circuit boards.

That, since the adhesive layer is formed to have an adhesion temperature in a range from 90° C. to 120° C., the adhesion temperature of the adhesive layer 141 is about 40° C. or more lower than the processing temperature (that is, melting point) of the flexible base substrate 110.

Therefore, the adhesive layer can minimize the defect ratio while preventing deterioration in the reliability of the multilayer printed circuit boards. Here, the optimum adhesion temperature that can minimize the defect ratio of the multilayer printed circuit boards while preventing deterioration of the reliability of the multilayer printed circuit boards is about 100° C.

The adhesive layer is formed to have an adhesion temperature in a range from about 90° C. to 120° C. and is made of a thermoplastic resin that can adhere to the internal circuit pattern and the flexible base substrate 110. To this end, the adhesive layer is made of a thermoplastic resin in which polypropylene and polyethylene (PE) are mixed. In this case, the adhesive layer is formed such that polyethylene has a higher proportion than polypropylene.

The adhesive layer is formed to have a thickness that is equal to or less than the thickness of the flexible base substrate 110. That is, when the adhesive layer is formed to be thicker than the thickness of the flexible base substrate 110, the thickness of the multilayer printed circuit board is increased. Therefore, the thickness of the adhesive layer is smaller than or the same as the thickness of the flexible base substrate 110.

In this case, it is preferable that the thickness of the adhesive layer be about 1/10 times the thickness of the flexible base substrate 110. That is, since the thickness of the flexible base substrate 110 is within a range from 20 μm to 60 μm, the thickness of the adhesive layer is within a range from 2 μm to 6 μm.

The thickness of the adhesive layer is formed to be larger than or equal to the thickness of an object (that is, the internal circuit pattern of another flexible base substrate) to which the adhesive layer is to be attached. That is, when the thickness of the adhesive layer is smaller than the thickness of the metal (object to which the adhesive layer is to be attached), the bonding force is insufficient. Therefore, it is preferable that the thickness of the adhesive layer is equal to or smaller than the thickness of the object to which the adhesive layer is to be attached.

Although preferred embodiments of the present disclosure have been described hereinabove, the preferred embodiments may be modified in diverse manners. Thus, those skilled in the art will appreciate that various modifications and changes are possible, without departing from the scope and spirit of the present disclosure defined by the appended claims.

EXPLANATION OF REFERENCE NUMERALS IN THE DRAWINGS

| 100 | flexible board | 110 | flexible base substrate |
|---|---|---|---|
| 120 | first via hole | 130 | internal circuit pattern, plating layer |
| 140 | protective layer | 200 | cured base substrate |
| 300 | external circuit pattern | 400 | second via hole |

The invention claimed is:

1. A method of manufacturing a printed circuit board, the method comprising:
    preparing a flexible board including a flexible region and a rigid region;
    preparing a cured base substrate; and
    laminating the cured base substrate on the rigid region of the flexible board,
    wherein the preparing of the flexible board comprises:
    preparing a flexible base substrate;
    forming a first via hole in a flexible region of the flexible base substrate;
    forming a plating layer by plating one surface of the flexible base substrate and an inside wall surface of the first via hole;
    etching the plating layer to form an internal circuit pattern; and
    forming a protective layer to cover the internal circuit pattern,
    forming a second via hole within the rigid region of the flexible board;
    filling the second via hole formed in the flexible board with a conductive material,
    wherein the preparing the cured base substrate comprises:
    forming a via hole communicating with the second via hole in the cured base substrate;
    filling the via hole communicating with the second via hole formed in the cured base substrate with a conductive material;
    wherein the laminating comprises:
    laminating the cured base substrate where the via hole communicating with the second via hole is formed on the rigid region of the flexible board where the second via hole is formed; and
    forming an external circuit pattern on one surface of the cured base substrate laminated on the flexible board.

2. The method according to claim 1, wherein the cured base substrate is a prepreg sheet that is formed by shaping an epoxy region in which glass fiber is contained in the form of a sheet.

3. The method according to claim 1, wherein in the laminating of the cured base substrate, the second via hole formed in the cured base substrate is disposed on the second via hole formed in the flexible board.

\* \* \* \* \*